US010375822B2

(12) United States Patent
Li et al.

(10) Patent No.: US 10,375,822 B2
(45) Date of Patent: Aug. 6, 2019

(54) CIRCUIT BOARD WITH RETURN PATH SEPARATED LOW CROSSTALK VIA TRANSITION STRUCTURE

(71) Applicant: Advanced Micro Devices, Inc., Sunnyvale, CA (US)

(72) Inventors: Yuan Li, San Diego, CA (US); James R. Foppiano, Austin, TX (US); Jonathan P. Dowling, Austin, TX (US); Gerald J. Merits, Austin, TX (US); Manjunath Shivappa, Austin, TX (US); Wasim I. Ullah, Austin, TX (US); Claude Hilbert, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/379,994

(22) Filed: Dec. 15, 2016

(65) Prior Publication Data

US 2018/0177043 A1    Jun. 21, 2018

(51) Int. Cl.
| | | |
|---|---|---|
| *H01P 3/08* | (2006.01) | |
| *H05K 1/02* | (2006.01) | |
| *H05K 1/11* | (2006.01) | |
| *H05K 3/40* | (2006.01) | |

(52) U.S. Cl.
CPC .......... *H05K 1/0245* (2013.01); *H01P 3/081* (2013.01); *H05K 1/0251* (2013.01); *H05K 1/0298* (2013.01); *H05K 1/116* (2013.01); *H05K 3/4038* (2013.01)

(58) Field of Classification Search
CPC .. H05K 1/0245; H05K 1/0251; H05K 3/4038; H05K 2201/09236; H01P 3/081

USPC ......................................................... 333/4, 5
See application file for complete search history.

(56) References Cited

U.S. PATENT DOCUMENTS

| | | | | |
|---|---|---|---|---|
| 6,023,211 A | * | 2/2000 | Somei ..................... | H01P 3/081 174/262 |
| 2016/0150645 A1 | * | 5/2016 | Gailus ................... | H05K 1/0222 174/266 |

OTHER PUBLICATIONS

Agilent Technologies; *De-emphasized Signal Generation with the Agilent N4916A De-Emphasis Signal Converter*-Application Note; http://application-notes.digchip.com/018/18-27236.pdf; Feb. 7, 2008; pp. 1-20.

Ransom Stephens; Agilent Technologies; *Equalization: The Correction and Analysis of Degraded Signals*-White Paper; http://cp.literature.agilent.com/litweb/pdf/5989-3777EN.pdf; Aug. 15, 2005; pp. 1-12.

Agilent Technologies; *Agilent De-emphasized Signal Generation with the Agilent 81250A ParBERT*-Application Note; http://cp.literature.agilent.com/litweb/pdf/5990-4053EN.pdf; Oct. 1, 2009; pp. 1-20.

(Continued)

*Primary Examiner* — Steohen E. Jones
(74) *Attorney, Agent, or Firm* — Timothy M. Honeycutt

(57) ABSTRACT

Various circuit boards and systems are disclosed. In one aspect a system includes a circuit board and n differential signal via pairs. Each of the n differential signal via pairs has a first signal via and a second signal via and an electrical wall between the first signal via and the second signal via. There is a midline between every two adjacent differential via pairs. There are n ground return path vias. Each of the n ground return path vias is positioned substantially along one of the midlines and not on one of the electrical walls.

20 Claims, 8 Drawing Sheets

(56) References Cited

OTHER PUBLICATIONS

Wikipedia; *Differential Signaling*; https://en.wikipedia.org/wiki/Differential_signaling; Nov. 5, 2016; pp. 1-4.
Wikipedia; *Differential TTL*; https://en.wikipedia.org/wiki/Differential_TTL; Mar. 8, 2010; p. 1.
Barry Olney; In-Circuit Design Pty Ltd, Australia; *Differential Pair Routing*; http://www.icd.com.au/articles/Differential_Pair_Routing_PCB-Oct2011.pdf; The PCB Magazine; Oct. 2011; pp. 48-52.
Eclips; *Embedded Cooling Layer—Interactive Power System*; https://www.cirexx.com/eclips/; 2016; pp. 1-4.
www.reseachgate.net; *Fig. 7 Cross section via the LLRF hardware motherboard with layer*; https://www.researchgate.net/figure/234052943_fig6_Fig-7-Cross-section-via-the-LLRF-hardware-motherboard-with-layer-description-and; Nov. 2, 2016; pp. 18.
Wikipedia; *Low-voltage differential signaling*; https://en.wikipedia.org/wiki/Low-voltage_differential_signaling; Oct. 12, 2016; pp. 1-6.
Wikipedia; *Microstrip*; https://en.wikipedia.org/wiki/Microstrip; May 21, 2016; pp. 1-4.
Wikipedia; *Stripline*; https://en.wikipedia.org/wiki/Stripline; Nov. 7, 2016; pp. 1-2.
Wikipedia; Via fence; https://en.wikipedia.org/wiki/Via_fence; Mar. 9, 2016; pp. 1-4.

\* cited by examiner

CIRCUIT BOARD WITH RETURN PATH SEPARATED LOW CROSSTALK VIA TRANSITION STRUCTURE

BACKGROUND OF THE INVENTION

1. Field of the Invention

This invention relates generally to semiconductor processing, and more particularly to circuit boards and differential signal propagation for such circuit boards.

2. Description of the Related Art

Modern processors communicate with peripherals and other devices at sometimes very high data rates and operating frequencies. To accommodate such high data rates, conventional processors often use high density interconnects. Differential signaling is used for many such high density interconnects. In some conventional designs, many differential signal pairs (pairs of signal traces) are mapped in a small space and are forced to use minimum geometries, such as width, thickness and spacing, that can be afforded by prevailing design rules. The minimum geometries are beneficial from the aspect of reduced capacitive loading on transmission lines for high data rates. However, the minimum spacing can lead to high crosstalk issues between adjacent differential pairs.

Some conventional designs address the problem of differential signal pair crosstalk by various filtering techniques, such as pre-shoot, de-emphasis equalization and continuous time linear equalization. These techniques use on-die circuitry to perform the signal conditioning techniques. Of course, there is a performance overhead associated with these techniques and silicon space is consumed.

Differential signal vias, which often traverse one or more layers of a circuit board present certain challenges. A server platform for modern microprocessors have many high speed interfaces, including USB, DisplayPort, PCIe, SATA and DDR. To accommodate these various interfaces, systems boards have grown to ten layers or more for signals and power delivery. Using thin materials, such as thin metal layer and low k dielectrics, can somehow reduce the overall platform thickness while keeping the impedance constant. The cost of using thin and low k plastic materials is high and thin metal layers can lead to DC IR drop penalty. Another issue for relatively thick boards is that long via transitions cause high far end crosstalk. The far end crosstalk induced by electrical and magnetic couplings is strongly affected by the length of coupling: the thicker the board, the longer the differential signal transition vias. The crosstalk also gets worse when high speed differential signals are crowded together, particularly when they share the same return current. When the return path is shared by several differential pairs, the return currents for them overlap one on top of each other. Indeed, the return current overlap is a fundamental factor of crosstalk. Traditionally, the one ground via is shared by two or more nearby differential pairs. Each pair draws its own return current that overlaps on the same ground via surface.

The present invention is directed to overcoming or reducing the effects of one or more of the foregoing disadvantages.

SUMMARY OF THE INVENTION

In accordance with one aspect of the present invention, a circuit board is provided that includes a first differential signal via pair that has a first signal via and a second signal via and a first electrical wall between the first signal via and the second signal via. A second differential via pair has a third signal via and a fourth signal via and a second electrical wall between the third signal via and the fourth signal via. There is a first midline between the first differential signal via pair and the second differential signal via pair. A third differential signal via pair has a fifth signal via and a sixth signal via and a third electrical wall between the fifth signal via and the sixth signal via. There is a second midline between the third differential signal via pair and the second differential signal via pair. A first ground return path via is positioned substantially along the first midline and not on the first electrical wall or the second electrical wall and a second ground return path via is positioned substantially along the second midline and not on the second electrical wall or the third electrical wall.

In accordance with another aspect of the present invention, a system is provided. The system includes a circuit board and n differential signal via pairs. Each of the n differential signal via pairs has a first signal via and a second signal via and an electrical wall between the first signal via and the second signal via. There is a midline between every two adjacent differential via pairs. There are n ground return path vias. Each of the n ground return path vias is positioned substantially along one of the midlines and not on one of the electrical walls.

In accordance with another aspect of the present invention, a method of manufacturing is provided. The method includes fabricating a circuit board and fabricating n differential signal via pairs on the circuit board. Each of the n differential signal via pairs has a first signal via and a second signal via and an electrical wall between the first signal via and the second signal via. There is a midline between every two adjacent differential via pairs. N ground return path vias are fabricated on the circuit board. Each of the n ground return path vias is positioned substantially along one of the midlines and not on one of the electrical walls.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Various circuit boards with differential signal transition vias are disclosed. Instead of using circuit layouts where multiple differential signal transition via pairs share a common return path via, multiple ground return path vias are clustered in a group of differential signal transition via pairs. The ground return path vias may be positioned on midlines between adjacent differential signal transition via pairs and in such a way as to avoid the electrical walls that exist between each via of a pair of differential signal transition vias. The crosstalk associated with overlapping induced currents on a shared ground via is reduced. Additional details will now be described.

Figure 1:
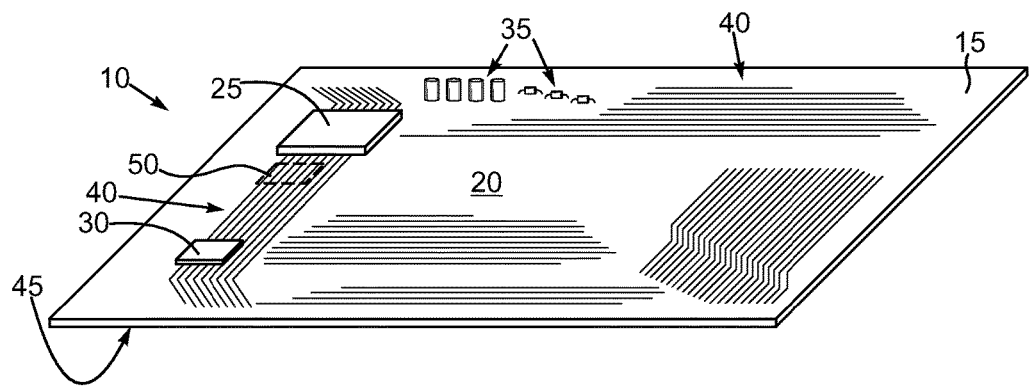
FIG. 1 is a pictorial view of an exemplary circuit system including a circuit board.

In the drawings described below, reference numerals are generally repeated where identical elements appear in more than one figure. Turning now to the drawings, and in particular to FIG. 1, therein is depicted a pictorial view of an exemplary conventional circuit system 10. The circuit system 10 may include a circuit board 15 that, as described more below, may consist of plural stacked layers of conductor structures and insulating material layers. A top surface 20 of the circuit board 15 may be populated with plural components, a few of which are labeled 25, 30 and 35, respectively. The components 25, 30 and 35 may be integrated circuits, capacitors, resistors or other electronic components. The circuit board 15 may include large numbers of conductor traces to convey ground power and signals. A few of these traces are shown on the top surface 20 and labeled 40 collectively. It should be understood that the lower surface 45 of the circuit board 15 may be similarly populated with traces and components that are not visible. The circuit board 15 may be a system board, a circuit card, a package substrate or other type of circuit board as desired. A small portion of the circuit board 15 is circumscribed by the dashed box 50 in FIG. 1. That portion of the circuit board 15 circumscribed by the dashed box 50 is depicted at larger scale in FIG. 2.

Figure 2:
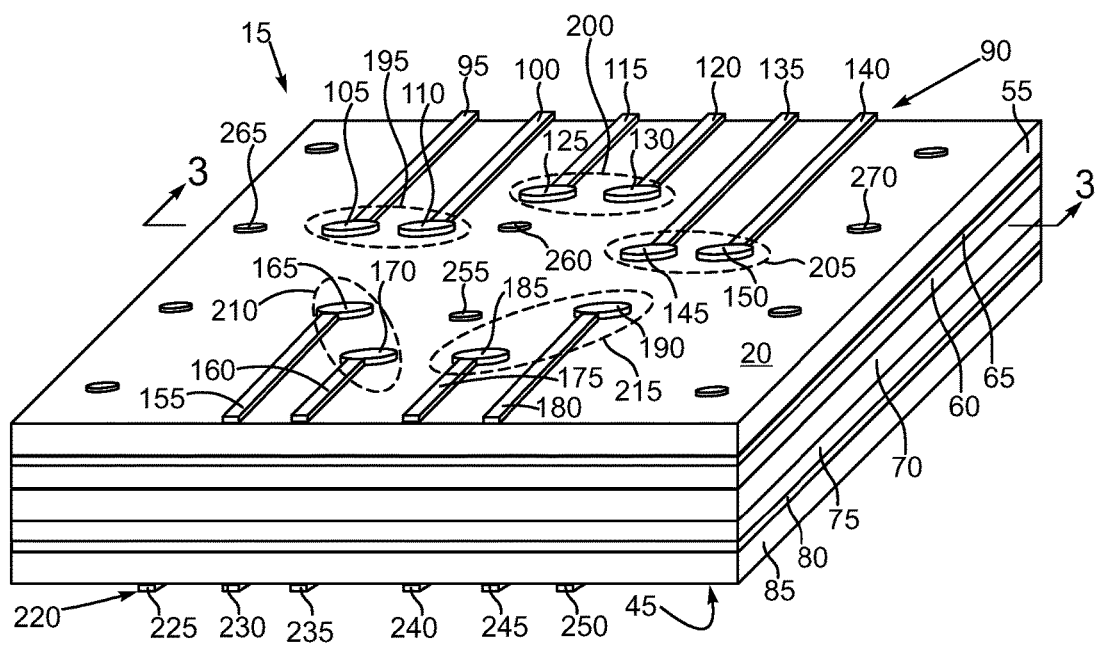
FIG. 2 is a pictorial view of a selected portion of the circuit board of FIG. 1.

As shown in FIG. 2, the circuit board substrate 20 may include multiple layers and in this instance, a top insulating layer 55, an intermediate insulating layer 60 that includes a ground plane 65, an intermediate insulating layer 70, an intermediate insulating layer 75 that includes a power plane 80 and a bottom insulating layer 85. A signal plane 90 is fabricated on the top insulating layer 55. The signal plane 90 may be configured as a micro strip arrangement as shown and thus include plural signal traces and transition vias. For example, the signal plane 90 may include signal traces 95 and 100 that are connected to transition vias 105 and 110, respectively. In addition, there may be signal traces 115 and 120 connected to transition vias 125 and 130, traces 135 and 140 connected to transition vias 145 and 150, traces 155 and 160 connected to transition vias 165 and 170 and traces 175 and 180 connected to transition vias 185 and 190, respectively. The traces 95 and 100 make up a differential signal pair and thus the vias 105 and 110 may constitute a differential signal via pair 195. The vias 125 and 130 similarly make up a differential signal via pair 200, the vias 145 and 150 make up another differential signal via pair 205, the vias 165 and 170 make up still another differential signal via pair 210 and the vias 185 and 190 make up another differential signal via pair 215. The via pairs 195, 200 and 205 may be used to provide conducting pathways through the circuit board 15 to another signal plane 220 positioned on the lower surface 45 of the circuit board 15 and thus on the lower surface of the lower insulating layer 85. The lower signal plane 220 may include plural conductor traces, a few of which are shown and labeled 225, 230, 235, 240, 245 and 250 respectively. Thus, the transition vias 105 and 110 may traverse the layers of the substrate 20 and make electrical contact with, for example, the traces 225 and 230 of the lower signal plane 220 and so on for the other depicted vias.

Figure 3:
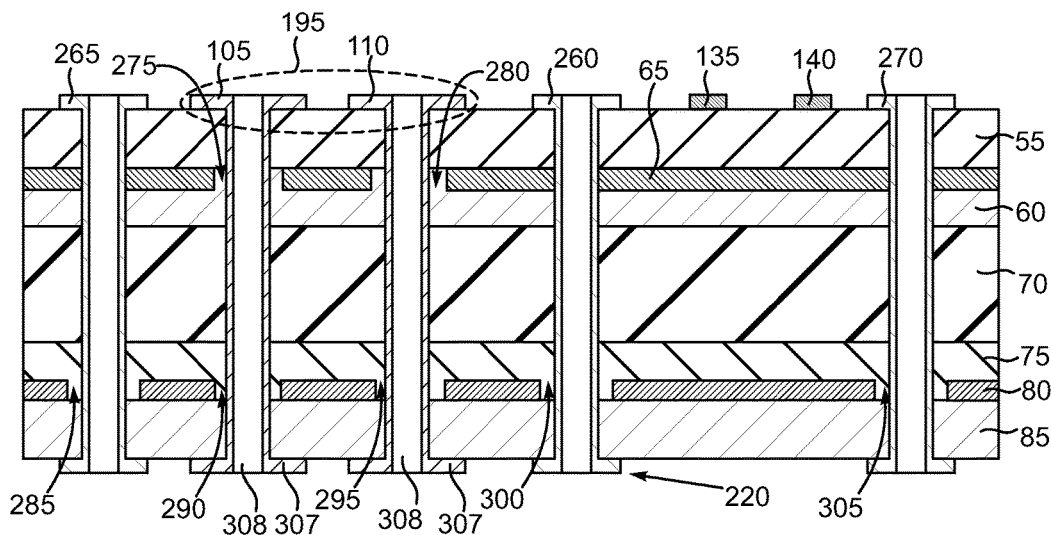
FIG. 3 is a sectional view of FIG. 2 taken at section 3-3.

The substrate 20 includes plural ground return path vias, a few of which are shown and labeled 255, 260, 265 and 270. These ground return vias 255, 260, 265 and 270 penetrate through the top insulating layer 155 and make ohmic contact with the ground plane 65. In this regard, attention is now turned also to FIG. 3, which is a sectional view of FIG. 2 taken at section 3-3. Note that section 3-3 passes through the ground return vias 260, 265 and 270 as well as the transition vias 105 and 110 making up the differential pair 195 and through the signal traces 135 and 140. As noted above, the ground vias 260, 265 and 270 traverse the circuit board 15 and establish ohmic contact with the ground plane 65, which may be a sheet like conductor structure composed of copper, aluminum or other conductor materials. The signal vias 105 and 110 similarly may traverse the circuit board 15, including the insulating layers 55, 60, 70, 75 and 85, to establish connections to the signal plane 220 of the lower side 45. Like the ground plane 65, the power plane 80 may be a sheet-like conductor layer composed of copper, aluminum or other conductor materials that connects to various traces and vias (not visible). The ground plane 65 includes appropriate openings at 275 and 280 so that the signal vias 105 and 110 do not make ohmic contact therewith. The power plane 80 similarly includes openings 285, 290, 295, 300 and 305 so as not to establish ohmic contact with the ground vias 260, 265 and 270 and the signal vias 105 and 110. The insulating layers 55, 60, 70, 75 and 85 may be composed of prepreg, curable rosin layers or other types of polymeric materials. The vias, for example the signal vias 105 and 110, may be configured as plated through holes as shown and thus include top and bottom pads 307 and internal bores 308. Optionally, the bores 308 need not be present in that a given via may be a solid cylindrical or other wide structure. The ground vias 260, 265 and 270 provide ground return paths for currents induced by magnetic fields generated by currents flowing in the differential pairs 105 and 110. Note that in the conventional design depicted in FIGS. 2 and 3 there is very little symmetry with respect to the positioning of the differential pairs 195, 200, 205, 210 and 215 with regard to the ground vias 260, 265, etc. Another problem with conventional circuit board designs noted in the Background section above is that in circumstances where multiple differential pairs, for example the pairs 195 and 200, predominantly share a single ground return via, say the via 260, that via 260 may end up conveying multiple currents from competing differential pairs and this can create a variety of different unwanted modes, which can significantly increase the unwanted crosstalk between the differential pairs.

Figure 4:
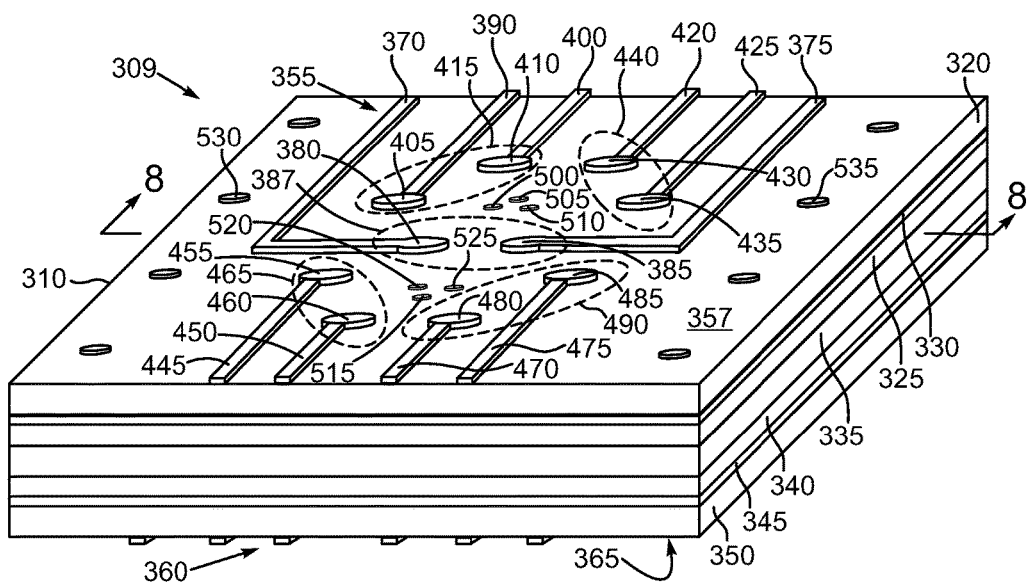
FIG. 4 is a pictorial view of a selected portion of an exemplary embodiment of a circuit board and circuit system.

An exemplary embodiment of a circuit system 309 that includes a circuit board 310 is depicted in FIG. 4, which is a pictorial view. The circuit board 310 incorporates various features to reduce crosstalk. FIG. 4 is similar to the pictorial view shown in FIG. 2 of a conventional circuit board in that FIG. 4 depicts a relatively small portion of what may be an otherwise much larger circuit board structure. In this illustrative embodiment, the circuit board 310 may include multiple layers, such as a top insulating layer 320, an intermediate insulating layer 325 that may include a ground plane 330, an intermediate insulating layer 335, an intermediate insulating layer 340 that may incorporate a power plane 345 and a lower insulating layer 350. The circuit board 310 may include two or more signal planes and clearly more than five layers as desired. In this illustrative embodiment, the circuit board 310 may include a signal plane 355 that may be positioned at virtually any level and in this illustrative embodiment on the top surface 357 of the upper insulating layer 320. Another signal plane 360 may be positioned elsewhere in or on the circuit board 310 and in this illustrative embodiment on the underside 365 of the insulating layer 350. The signal plane 355 may include single ended and differential signal routing. In this regard, for example, there may be signal traces 370 and 375 connected to transition vias 380 and 385, respectively. The transition vias 380 and 385 make up a differential via pair 387. Note that the traces 370 and 375 are depicted with a lateral spacing that is larger than traditional differential pair layout techniques just for simplicity of illustration. Of course, the traces 370 and 375 may be spaced closer than depicted. There may also be traces 390 and 400 connected to respective vias 405 and 410, where the vias 405 and 410 make up another differential via pair 415. Traces 420 and 425 may be connected to vias 430 and 435, where the vias 430 and 435 make up another differential via pair 440. Traces 445 and 450 may be connected to vias 455 and 460 where the vias 455 and 460 make up another differential via pair 465. In addition, traces 470 and 475 may be connected to vias 480 and 485, where the vias 480 and 485 make up another differential via pair 490. In lieu of a single ground return via to provide a ground return for currents induced by the differential pairs 387, 415, 440, etc. to the ground plane 330, what would otherwise be a single ground return via, such as the via 260 shown in FIG. 2, is split into three independent ground return vias 500, 505 and 510. There may be a similar set of three ground return vias 515, 520 and 525 positioned in a somewhat central location relative to the via pairs 387, 465 and 490. The ground return vias 500, 505 and 510 are positioned in selected locations relative to the differential via pairs 387, 415 and 440 in order to provide reduced levels of crosstalk as described in more detail below. The same is true with regard to the positioning of the vias 515, 520 and 525 relative to the differential via pairs 387, 465 and 490. There may be additional ground return vias, a few of which are labeled 530 and 535, at various locations on the circuit board 310. It should be understood that the numbers of differential signal pairs 387, 465, etc., and the number of ground return vias 500, 505, 520 may be varied. In an exemplary embodiment, there may be n differential signal pairs 387, 465, etc., and n ground return vias 500, 505, 520, etc. where n is an integer greater than 1. A differential pair, such as the differential pair 387, can be part of more than one group of differential pairs. For example one grouping may be differential pairs 387, 415 and 440 and another grouping may be differential pairs 387, 465 and 490.

Figure 5:
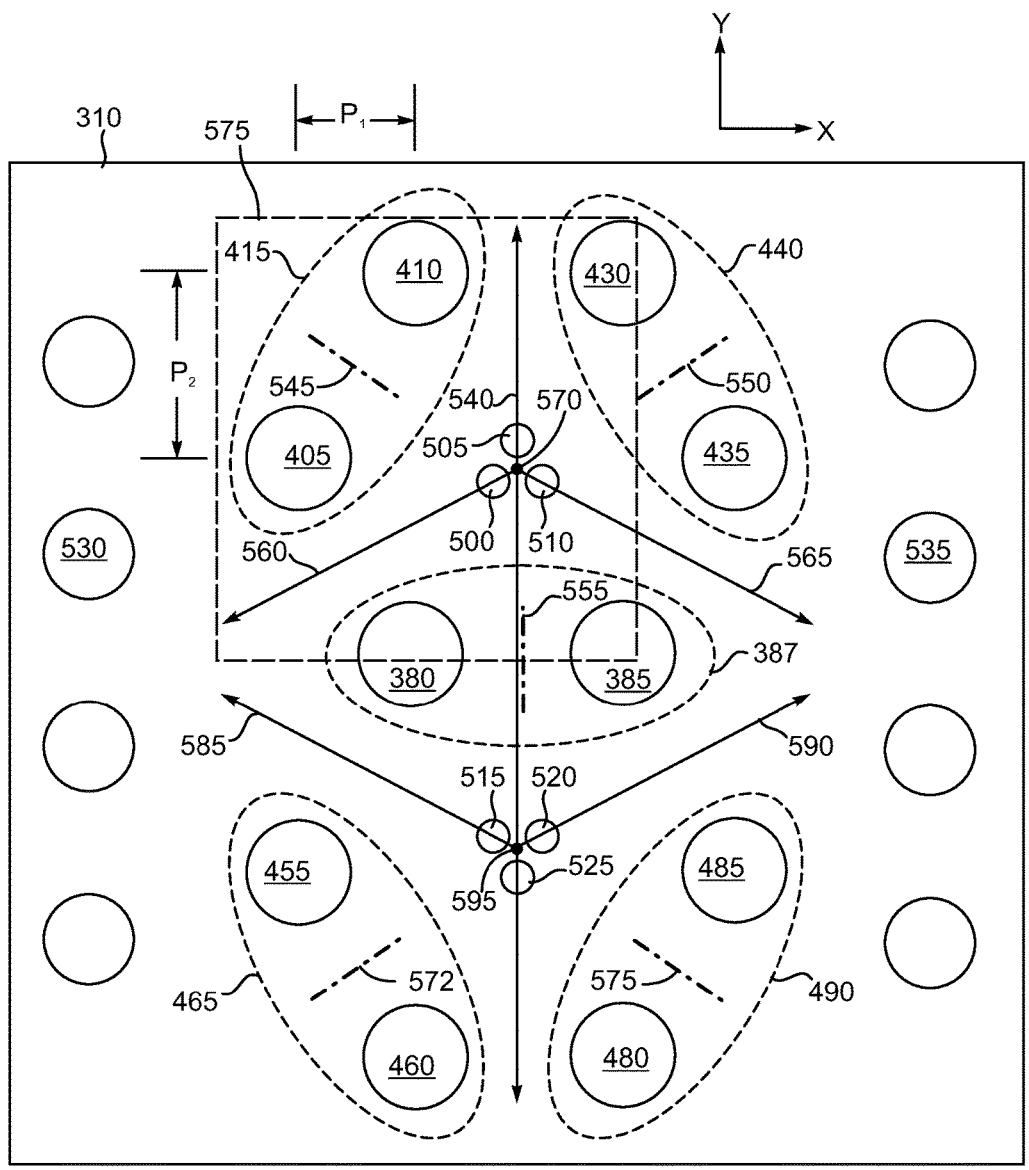
FIG. 5 is a simplified plan view of the portion depicted in FIG. 4.

The geometries associated with the differential pairs 387, 415, 440, 465 and 490 as well as the ground return vias 500, 505, 510, 515, 520 and 525 will be described now in conjunction with FIG. 5, which is an overhead view of the portion of the circuit board 310 depicted in FIG. 4. However, FIG. 5 is simplified so that the traces, such as the traces 370 and 375 shown in FIG. 4, are not depicted. The vias of a given pair, such as the vias 405 and 410 of the differential via pair 415, may be spaced along an x-axis with a first pitch $P_1$ and spaced along a y-axis with a second pitch $P_2$ where $P_1$ may or may not equal $P_2$. Other pairs, such as the vias 380 and 385 of the pair 387, may similarly be spaced along the x-axis with the pitch $P_1$ (or another pitch) but be substantially at the same location relative to the y-axis. The vias of differential pairs, such as the vias 405 and 410 of the differential pair 415, and the vias 430 and 435 of the differential pair 440, may be symmetrically located with respect to a midline 540. Indeed the pairs 465 and 490 may be symmetrically disposed relative to the midline 540 as well. Furthermore, the vias 380 and 385 of the pair 387 may be symmetrically disposed with regard to the midline 540.

Here, the six vias 380, 385, 405, 410, 430 and 435 are configured in a generally hexagonal arrangement. However, other geometric structures, such as rectangular, circular, octagonal or others may be used as well. Here, the six vias 380, 385, 455, 460, 480 and 485, of the pairs 387, 465 and 490, may also be configured in a generally hexagonal or other arrangement. A hexagonal arrangement can yield tighter packing of vias and traces. There is an electrical wall 545 associated with the vias 405 and 410 of the pair 415, an electrical wall 550 associated with the vias 430 and 435 of the pair 440 and an electrical wall 555 associated with the vias 380 and 385 of the pair 387. An electrical wall is a plane of electrical equipotential. The wall 555 is substantially coincident with the midline 540. The midline 540 represents the geometric mid-point between the differential via pairs 415 and 440 and the individual vias 380 and 385. Similarly, there is a midline 560, which represents a geometric midline between the differential via pairs 387 and 415. Likewise there is another midline 565, which represents a geometric midline between the differential via pair 387 and the differential via pair 440. The midlines 540, 560 and 565 intersect at a center point 570. The vias 385, 405, 410, etc. may be positioned substantially equidistant from this center point 570. There is an electrical wall 572 associated with the vias 455 and 460 of the differential via pair 465 and an electrical wall 575 associated with the vias 480 and 485 of the differential via pair 490. Similarly, there is a midline 585, which represents a geometric midline between the differential via pairs 387 and 465. Likewise there is another midline 590, which represents a geometric midline between the differential via pair 387 and the differential via pair 490. The midlines 540, 585 and 590 intersect at a center point 595. The arrangement of the differential via pairs 465 and 490 may be a mirror image of the differential via pairs 415 and 440 relative to the differential via pair 387.

Figure 6:
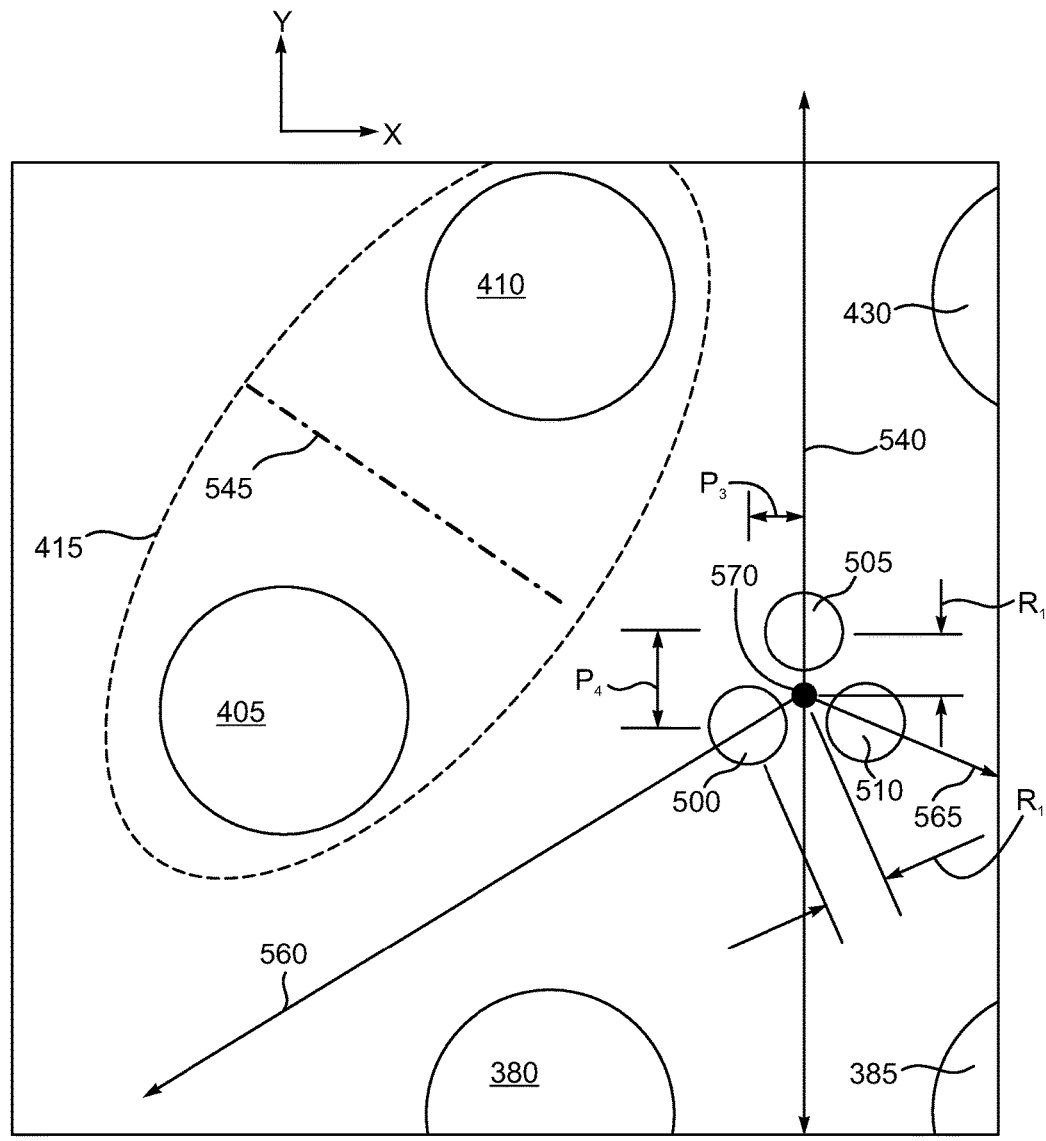
FIG. 6 is a portion of FIG. 5 at greater magnification.

The ground return via 500 is advantageously positioned away from the center point 570 along the midline 560 some distance greater than zero. The ground return via 505 may be positioned away from the center point 570 along the midline 540 some distance greater than zero to be described below. Finally, the ground return via 510 may be positioned along the midline 565 some distance greater than zero to be described below. Note the location of the dashed box 575 in FIG. 5. The portion of FIG. 5 circumscribed by the dashed box 575 is shown at greater magnification in FIG. 6. Attention is now turned to FIG. 6 so that additional details of the geometries associated with the ground return vias 500, 505 and 510 may be described. It should be noted that the ground path vias 500, 505 and 510 may be spaced along the x-axis a first pitch $P_3$ and spaced along the y-axis a second pitch $P_4$ where $P_3$ and $P_4$ may or may not be equal, and $P_3$ and $P_4$ may or may not be equal to $P_1$ and $P_2$ shown in FIG. 5. As shown in FIG. 6, the ground return via 500 may be positioned at some distance $R_1$ along the midline 560 relative to the center point 570 and the via 505 may be similarly positioned the distance $R_1$ along the midline 540 relative to the center point 570 and so on for the via 510 along the midline 565. Positioning the ground return via 500 along the midline between the pairs 387 and 415 and not on an electrical wall, such as the electrical wall 545 of a particular pair 415, provides reduced crosstalk due to symmetry and to the fact that each differential pair, such as the pairs 387 and 415, receives the benefit of more than one return path via.

Figure 7:
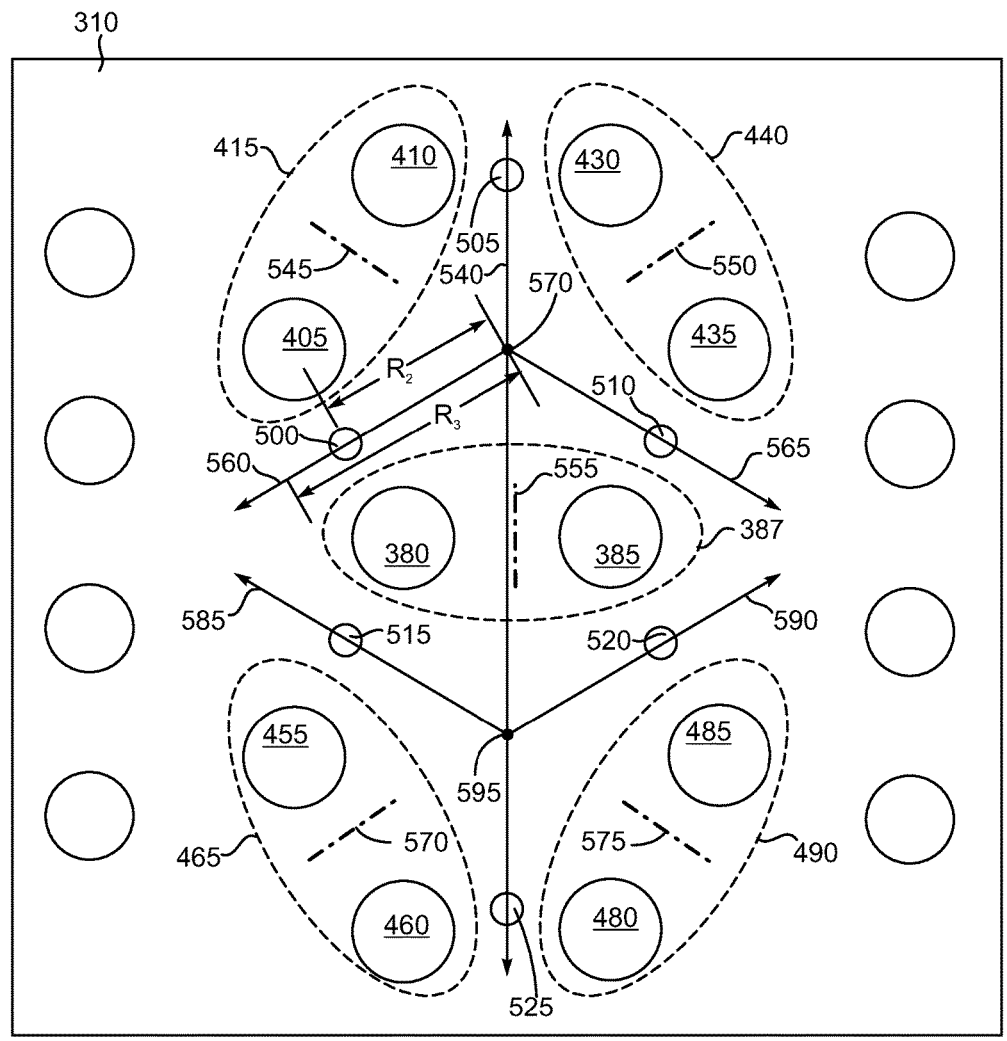
FIG. 7 is a simplified plan view like FIG. 5, but of another exemplary embodiment of a circuit board arrangement.

As noted above, the ground return vias 500, 505 and 510 may be positioned at various locations along the midlines 540, 560 and 565. In this regard, attention is now turned to FIG. 7, which is a simplified overhead view like FIG. 5. The arrangement of the vias 380, 385, 405, 410, 430, 435, 455, 460, 480 and 485 as differential pairs 387, 415, 440, 465 and 490, and of the midlines 540, 560, 565, 585 and 590 may be as described above. Here, however, the ground return vias 500, 505 and 510 may be positioned at some distance $R_2$ along the midlines 560, 540 and 565, respectively, and relative to the center point 570 or even at some further distance $R_3$. The same is true with regard to the positioning of the ground return vias 515, 520 and 525 along the midlines 585, 590 and 540 relative to the center point 595. Again, keeping the ground return vias 515, 520 and 525 away from the electrical walls 545, 550, 555, 572 and 575 is preferred. Simulations were performed to determine anticipated far end crosstalk for differential via pairs 465, 490, 387, 415 and 440 performed using Ansys HFSS (high frequency structure simulator) and SeaSim software programs. Ansys HFSS was used to extract an electrical model from a physical design and SeaSim was employed to generate the simulated crosstalk data using the extracted electrical model. For differential via pairs 465 and 490, transitions through five circuit board levels were simulated. For via pairs 387, 415 and 440, transitions through eight circuit board levels were simulated. The first column of the Table labeled "Crosstalk Shared Return Path" lists the crosstalk as if there were not the separated ground path vias 500, 505 and 510 or 515, 520 and 525, but just a single shared ground return path via. The last three columns of the Table list the values for different positions of the separated return path vias 500, 505 and 510 or 515, 520 and 525. It is evident that using separated path vias 500, 505 and 510 or 515, 520 and 525 improves crosstalk over a single shared return via, and this effect improves with increasing distance from the center points 570 and 595.

TABLE

| Differential Pair | Crosstalk (dB) Shared Return Path | Crosstalk (dB) Separated Return Path with $R_1$ = 6 mils | Crosstalk (dB) Separated Return Path with $R_2$ = 20 mils | Crosstalk (dB) Separated Return Path with $R_3$ = 34 mils |
|---|---|---|---|---|
| 465 (vias 455 and 460) | −38.0 | −38.8 | −44.6 | −51.4 |
| 490 (vias 480 and 485) | −38.0 | −38.8 | −44.5 | −51.2 |
| 387 (vias 380 and 385) | −25.5 | −26.2 | −32.7 | −44.7 |
| 415 (vias 405 and 410) | −27.5 | −28.0 | −33.0 | −42.6 |
| 440 (vias 430 and 435) | −27.4 | −28.0 | −33.0 | −42.5 |

Figure 8:
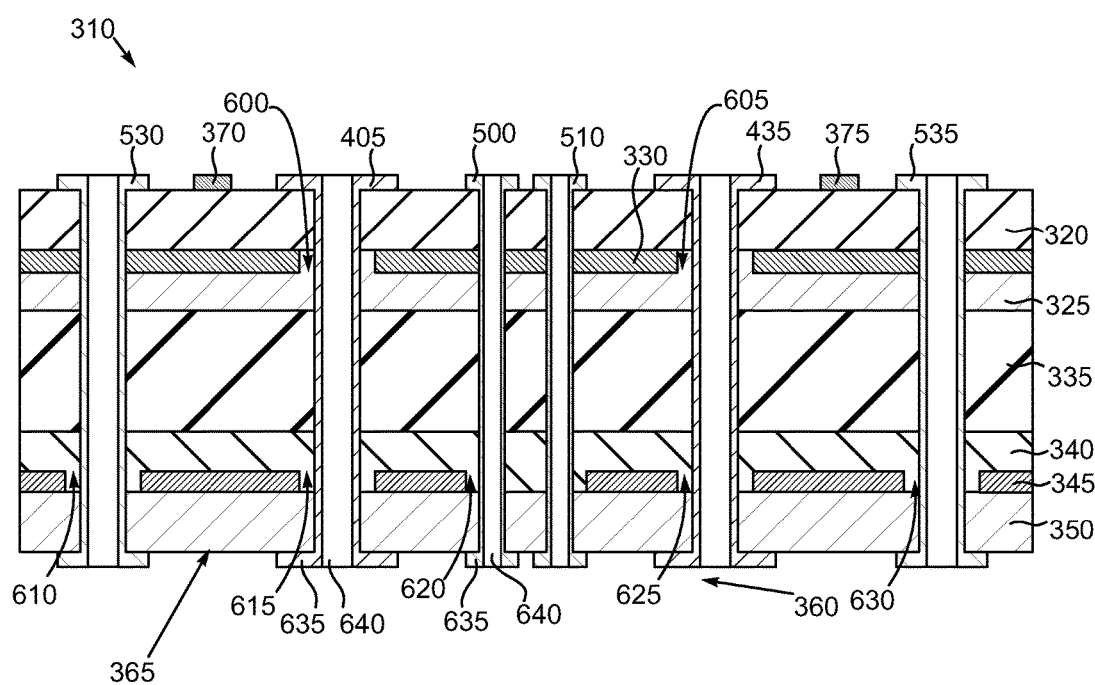
FIG. 8 is a sectional view of FIG. 4 taken at section 8-8.

Some additional details of the circuit board 310 may be understood by referring now to FIGS. 4 and 8. FIG. 8 is a sectional view of FIG. 4 taken at section 8-8. Note that section 8-8 passes through the ground vias 530, 500, 510 and 535, the signal vias 380 and 385 making up the differential pair 387, and the traces 370 and 375. The following descriptions of the ground vias 500, 510, 530 and 535 and the signal vias 405 and 435 will be illustrative of the other vias shown in FIG. 4. As noted above, the separated ground vias 500, 510, 530 and 535 traverse the circuit board 310 and establish ohmic contact with the ground plane 330, which may be a sheet like conductor structure composed of copper, aluminum or other conductor materials. There may be multiple ground planes and the ground vias 500, 510, 530 and 535 may connect to the same ground plane or different ground planes. The signal vias 405 and 435 similarly may traverse the circuit board 310 including the insulating layers 320, 325, 335, 340 and 350 to establish connections to the signal plane 360 of the lower side 365. Like the ground plane 330, the power plane 345 may be a sheet-like conductor layer that connects to various traces and vias (not visible) and may be composed of copper, aluminum or other conductor materials. The ground plane 330 includes appropriate openings at 600 and 605 so that the signal vias 405 and 435 do not make ohmic contact therewith. The power plane 345 similarly includes openings 610, 615, 620, 625 and 630 so as not to establish ohmic contact with the ground vias 530, 500, 510 and 535 and the signal vias 405 and 435. The insulating layers 320, 325, 335, 340 and 350 may be composed of prepreg, curable resin layers or other types of polymeric materials. If the circuit board 310 is configured as a package substrate then the various insulating layers 320, 325, etc. may be composed of build up layers using Ajinomoto sheets or other build up layer materials as desired. The ground vias 500, 510, 530 and 535 and the signal vias 405 and 435 may be configured as plated through holes as shown and thus include top and bottom pads 635 and internal bores 640. Optionally, the bores 640 need not be present in that a given via may be a solid cylindrical or other wide structure. The ground vias 500, 510, 530 and 535 and the signal vias 405 and 435 may be fabricated from copper, aluminum or other conductor materials and using well-known plating or other techniques. The diameters and thickness of the top and bottom pads 635 and the internal bores 640 as well as the traces 370 and 375 will vary depending on board size and prevailing process technologies.

Figure 9:
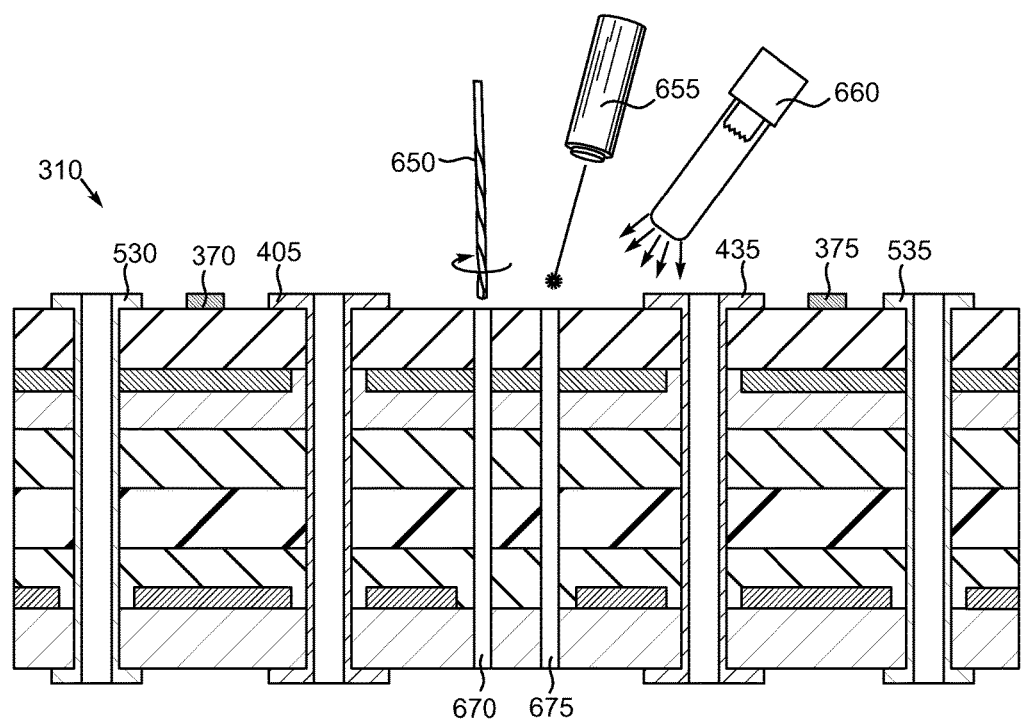
FIG. 9 is a sectional view like FIG. 8, but depicting exemplary via hole formation.

Suitable openings may be formed in the circuit board 310 to facilitate the subsequent fabrication of the ground vias 500 and 510 in a variety of ways. For example, FIG. 9 is a sectional view like FIG. 8, but depicting the circuit board 310 at the time of via hole formation. A mechanical drill 650, a laser drill 655 or even a photolithography system 660 may be used to establish via holes 670 and 675 in the circuit board 310 in which the vias 500 and 510 (see FIG. 8) may be subsequently formed by well-known plating or other material deposition processes. For example, it may be desirable to use the photolithography device 660 and in conjunction with layers with photoactive compounds so that the holes 670 and 675 may be fabricated using well-known exposure and development techniques. This may be appropriate in circumstances where, for example in a package design, the geometries of the holes 670 and 675 may be quite small and not easily amenable to drilling by way of mechanical drills 650 or even the laser drill 655. Similar techniques may be used to fabricate the other ground vias 530 and 535 and the signal vias 405 and 435. As noted above, the via holes 670 and 675 need not traverse the entirety of the circuit board 310. The various traces of the circuit board 310, including traces 370 and 375 and others, may be fabricated by etch definition, plating or other material deposition or patterning techniques.

Figure 10:
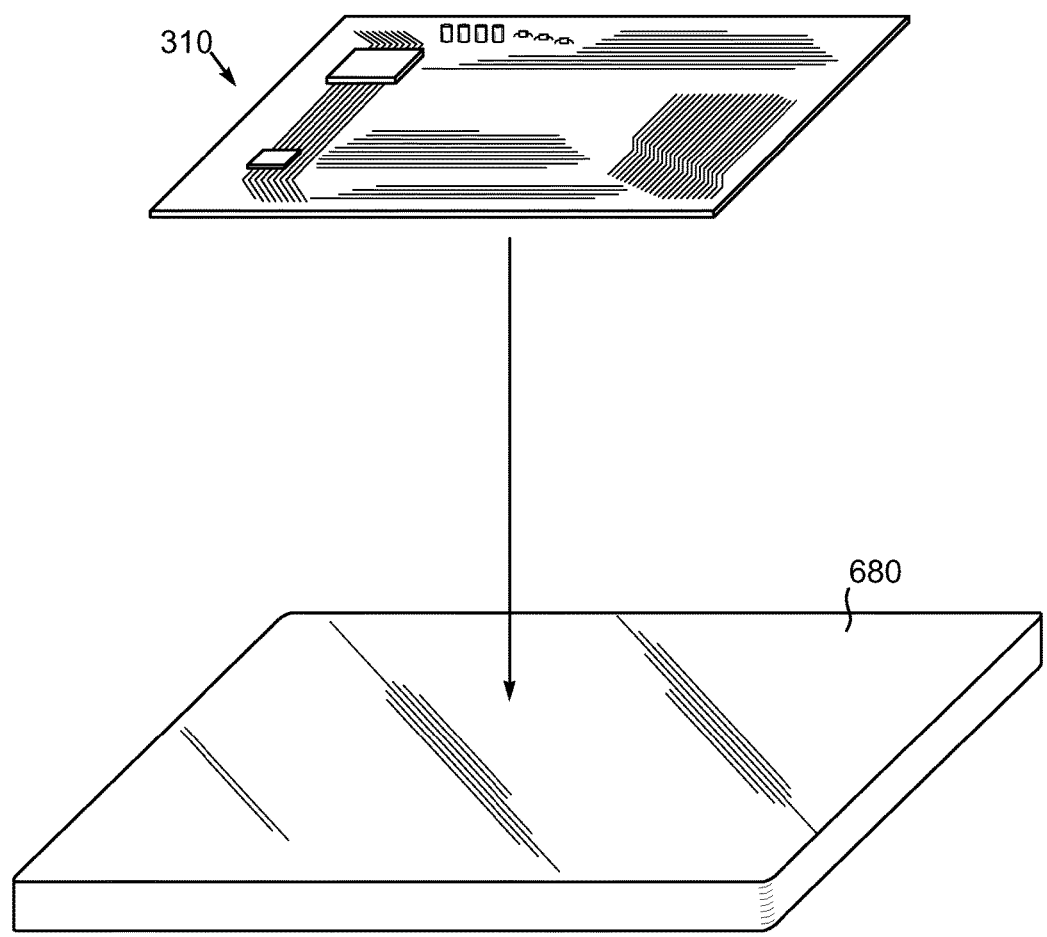
FIG. 10 is a partially exploded pictorial view depicting an exemplary circuit board exploded from an electronic device.

As depicted in FIG. 10, any of the disclosed embodiments of a circuit board 310 or otherwise may be mounted in an electronic device 680. The electronic device 680 may be a tablet computer, a cell phone handset, or virtually any other electronic device that may utilize a circuit board.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit board, comprising:
a first differential signal via pair having a first signal via and a second signal via and a first electrical wall between the first signal via and the second signal via;
a second differential via pair having a third signal via and a fourth signal via and a second electrical wall between the third signal via and the fourth signal via, there being a first midline between the first differential signal via pair and the second differential signal via pair;
a third differential signal via pair having a fifth signal via and a sixth signal via and a third electrical wall between the fifth signal via and the sixth signal via, there being a second midline between the third differential signal via pair and the second differential signal via pair;
a first ground return path via positioned substantially along the first midline and not on the first electrical wall or the second electrical wall and a second ground return path via is positioned substantially along the second midline and not on the second electrical wall or the third electrical wall.

2. The circuit board of claim 1, comprising a ground plane electrically coupled to the first ground return path via and the second ground return path via.

3. The circuit board of claim 1, a first signal plane and a second signal plane, the first, second and third differential signal via pairs connecting the first signal plane to the second signal plane.

4. The circuit board of claim 1, wherein the first, second and third differential signal via pairs and the first and second ground return path vias comprise plated through holes.

5. The circuit board of claim 1, wherein the first midline and the second midline intersect to define a center point, the first ground return path via being positioned substantially along the first midline away from the center point a first distance and the second ground return path via being positioned substantially along the second midline away from the center point the first distance.

6. The circuit board of claim 1, wherein the vias of the first differential signal via pair are spaced apart along an x-axis by a first pitch and along a y-axis by a second pitch and the first ground return path via is spaced apart from the second ground return path via along the x-axis by a third pitch and along the y-axis by a fourth pitch.

7. The circuit board of claim 6, wherein the first pitch is not equal to the third pitch and the second pitch is not equal to the fourth pitch.

8. The circuit board of claim 1, wherein at least one of the differential signal via pairs traverses less than the full thickness of the circuit board.

9. The circuit board of claim 1, wherein at least one of the differential signal via pairs traverses the full thickness of the circuit board.

10. A system, comprising:
a circuit board;
n differential signal via pairs, each of the n differential signal via pairs having a first signal via and a second signal via and an electrical wall between the first signal via and the second signal via, there being a midline between every two adjacent differential via pairs, the midline between two adjacent differential signal via pairs and the midline of another differential signal via pair adjacent to either of the two adjacent differential signal via pairs intersecting non-orthogonally;
n ground return path vias, each of the n ground return path vias positioned substantially along one of the midlines and not on one of the electrical walls; and
wherein n is an integer greater than 1.

11. The system of claim 10, comprising a ground plane electrically coupled to some or all of the n ground return path vias.

12. The system of claim 10, comprising a first signal plane and a second signal plane, at least some of the n differential signal via pairs connecting the first signal plane to the second signal plane.

13. The system of claim 10, wherein the n differential signal via pairs and the n ground return path vias comprise plated through holes.

14. The system of claim 10, wherein the midlines intersect to define a center point, each of the n ground return path vias being positioned substantially along one of the midlines away from the center point a first distance.

15. The system of claim 10, wherein the vias of each of the n differential signal via pairs are spaced apart along an x-axis by a first pitch and along a y-axis by a second pitch and each of the n ground return path vias is spaced apart from an adjacent of the n ground return path vias along the x-axis by a third pitch and along the y-axis by a fourth pitch.

16. The system of claim 15, wherein the first pitch is not equal to the third pitch and the second pitch is not equal to the fourth pitch.

17. The system of claim 10, wherein at least one of the n differential signal via pairs traverses less than the full thickness of the circuit board.

18. The system of claim 10, wherein at least one of the differential signal via pairs traverses the full thickness of the circuit board.

19. A method of manufacturing, comprising:
fabricating a circuit board;
fabricating n differential signal via pairs on the circuit board, each of the n differential signal via pairs having a first signal via and a second signal via and an electrical wall between the first signal via and the second signal via, there being a midline between every two adjacent differential via pairs, the midline between two adjacent differential via pairs and the midline of another differential signal via pair adjacent to either of the two adjacent differential signal via pairs intersecting non-orthogonally;
fabricating n ground return path vias on the circuit board, each of the n ground return path vias positioned substantially along one of the midlines and not on one of the electrical walls; and
wherein n is an integer greater than 1.

20. The method of claim 19, wherein the midlines intersect to define a center point, each of the n ground return path vias being positioned substantially along one of the midlines away from the center point a first distance.

* * * * *